(12) United States Patent
Aida et al.

(10) Patent No.: US 9,147,827 B2
(45) Date of Patent: Sep. 29, 2015

(54) PIEZOELECTRIC ELEMENT, PIEZOELECTRIC ACTUATOR, PIEZOELECTRIC SENSOR, HARD DISK DRIVE, AND INKJET PRINTER DEVICE

(71) Applicant: TDK CORPORATION, Tokyo (JP)

(72) Inventors: Yasuhiro Aida, Tokyo (JP); Katsuyuki Kurachi, Tokyo (JP); Hitoshi Sakuma, Tokyo (JP); Kazuhiko Maejima, Tokyo (JP)

(73) Assignee: TDK CORPORATION, Tokyo (JP)

( * ) Notice: Subject to any disclaimer, the term of this patent is extended or adjusted under 35 U.S.C. 154(b) by 552 days.

(21) Appl. No.: 13/687,785

(22) Filed: Nov. 28, 2012

(65) Prior Publication Data

US 2015/0194592 A1    Jul. 9, 2015

(51) Int. Cl.
    *H01L 41/187* (2006.01)
    *C04B 35/00* (2006.01)
    *H01L 41/08* (2006.01)
    *H01L 41/18* (2006.01)

(52) U.S. Cl.
    CPC ............ *H01L 41/0805* (2013.01); *H01L 41/18* (2013.01)

(58) Field of Classification Search
    USPC .................. 310/358; 252/69.2; 510/134, 136
    See application file for complete search history.

(56) References Cited

U.S. PATENT DOCUMENTS 8,288,020 B2    10/2012    Harigai et al.

FOREIGN PATENT DOCUMENTS

| DE | 102010041567 A1 * | 3/2012 | ............ H01L 41/187 |
| JP | WO-2005021461 A1 * | 3/2005 | ............ C04B 35/00 |
| JP | A-2009-130182 | 6/2009 | |
| JP | B1-4588807 | 12/2010 | |

OTHER PUBLICATIONS

Lee et al., "Effect of Mn Substitution on Ferroelectric and Leakage Current Characteristics of Lead-Free (K0.5Na—0.5)(Mn$_x$Nb$_{1-x}$)O3 Thin Films" Current Applied Physics 11 (2011) S266-S269.

Wang et al., "Enhanced Ferroelectric Properties in Mn-Doped K0.5Na—0.5NbO3 Thin Films Derived from Chemical Solution Deposition" Applied Physics Letters 97, 072902 (2010) 4 pages.

* cited by examiner

*Primary Examiner* — Thomas Dougherty
(74) *Attorney, Agent, or Firm* — Oliff PLC

(57) ABSTRACT

An object is to reduce the leakage current of a piezoelectric element including a potassium-sodium niobate thin film, enhance the reliability of the piezoelectric element and, in addition, enhance the withstand voltage by including a pair of electrodes and a piezoelectric layer sandwiched between the above-described pair of electrode layers, wherein the above-described piezoelectric layer is provided with at least one layer each of first piezoelectric layer which is a potassium-sodium niobate thin film substantially not containing Mn (manganese) and second piezoelectric layer which is a potassium-sodium niobate thin film containing Mn.

9 Claims, 8 Drawing Sheets

PIEZOELECTRIC ELEMENT, PIEZOELECTRIC ACTUATOR, PIEZOELECTRIC SENSOR, HARD DISK DRIVE, AND INKJET PRINTER DEVICE

BACKGROUND OF THE INVENTION

1. Field of the Invention

The present invention relates to a piezoelectric element by using a thin film piezoelectric material, a piezoelectric actuator including the piezoelectric element, and a piezoelectric sensor, and a hard disc drive provided with the thin film piezoelectric actuator and an ink-jet printer.

2. Background Art

In recent years, there is an increasing demand for a piezoelectric material becoming lead-free and research on potassium-sodium niobate ((K,Na)NbO$_3$ (hereafter may be referred to as KNN) has become active. It is believed that a relatively high Curie temperature and good piezoelectric characteristics are obtained by KNN among lead-free piezoelectric materials and, therefore, KNN has been noted.

In addition, instead of bulk piezoelectric materials, commercialization of a piezoelectric element by using a thin film piezoelectric material has proceeded. Examples include piezoelectric sensor taking advantage of a piezoelectric effect, in which a force applied to a piezoelectric layer is converted to a voltage, e.g., a gyro sensor, a pressure sensor, a pulse wave sensor, a shock sensor, and a microphone, piezoelectric actuators taking advantage of an inverse piezoelectric effect, in which a piezoelectric layer is deformed when a voltage is applied to the piezoelectric layer, e.g., a hard disc drive head assembly and an ink-jet print head, and a speaker, a buzzer, a resonator, and the like taking advantage of the inverse piezoelectric effect in the same manner.

In the case where a piezoelectric material is made into a thin film, miniaturization of an element becomes possible, applicable fields are expanded and, in addition, mass productivity increases because many elements can be produced on a substrate in one operation. Furthermore, there are many advantages in performances, for example, the sensitivity is improved in the case where a sensor is produced.

CITATION LIST

Patent Literature

[Patent Literature 1] Japanese Patent No. 4588807
[Patent Literature 2] Japanese Unexamined Patent Application Publication No. 2009-130182

Non Patent Literature

[Non Patent Literature 1] Lee et al: Current Applied Physics 11 (2011) S266
[Non Patent Literature 2] Wang et al: Applied physics Letters 97, 072902 (2010)

SUMMARY OF INVENTION

However, a KNN thin film has a problem in that, in the case where a voltage is applied to two electrodes sandwiching the KNN thin film, a large leakage current is generated and, thereby, a function as an actual piezoelectric element is not obtained easily. This is because if the leakage current is large, the element generates heat easily when a high voltage is applied to the two electrodes and the reliability of the element is degraded.

In addition, if the leakage current is large, there is also a problem in that a voltage is not applied to the piezoelectric layer effectively, and the piezoelectric characteristics of the element are degraded. Furthermore, there is also a problem in that the withstand voltage is degraded because of a large leakage current and, therefore, the element is broken easily when a high voltage is applied.

A technology to improve a leakage current characteristic by stacking different types of materials is mentioned as a technique to reduce the leakage current of the piezoelectric element (refer to Patent Literature 1). However, this technology has a problem in that the crystallinity of a piezoelectric layer is degraded and the piezoelectric characteristics are degraded because stacking of different types of materials having different lattice constants is necessary. In addition, different types of materials are present together and, thereby, mutual diffusion of the different types of materials occur easily and the piezoelectric characteristics and the reliability of the element are degraded easily.

A technology to improve a leakage current characteristic by inserting a high-resistance current block layer having a resistance value more than or equal to a predetermined value between electrodes is also mentioned (refer to Patent Literature 2). However, in such a configuration, a voltage is not applied to the piezoelectric layer easily because a high-resistance layer is present between the electrodes and the piezoelectric characteristics of the element are degraded.

A technology to improve a leakage current characteristic by reducing the hole density and oxygen vacancies through addition of Mn (manganese) to a KNN thin film is mentioned (refer to Non Patent Literatures 1 and 2). However, there are problems in that the dielectric loss increases and the piezoelectric characteristics are degraded because of addition of Mn.

The present invention has been made in consideration of the above-described problems included in the related art, and it is an object to provide a piezoelectric element which can ensure a larger displacement, wherein the leakage current of a piezoelectric element including a KNN thin film is reduced and, thereby, the reliability of the piezoelectric element is enhanced, the voltage resistance is enhanced, and the range of drivable voltage is enlarged.

Ensuring of a large displacement refers to that a large piezoelectric constant is exhibited. Therefore, an element on the basis of a piezoelectric effect can be applied to uses, e.g., a high-sensitivity sensor, and an element on the basis of an inverse piezoelectric effect can be applied to uses, e.g., an efficient actuator which can ensure large vibration by a small voltage.

In order to achieve the above-described object, a piezoelectric element according to the present invention includes a first electrode layer, a second electrode layer, and a piezoelectric layer sandwiched between the above-described first electrode layer and second electrode layer, wherein the piezoelectric layer is provided with at least one layer each of first piezoelectric layer which is a potassium-sodium niobate thin film substantially not containing Mn and second piezoelectric layer which is a potassium-sodium niobate thin film containing Mn. Here, the term "substantially not containing" refers to "not containing except incidental impurities".

In the case where at least one layer each of first piezoelectric layer which is a KNN thin film substantially not containing Mn and second piezoelectric layer which is a KNN thin film containing Mn is included, a leakage current of the element can be reduced and, in addition, degradation in the piezoelectric characteristics can be suppressed.

It is believed that the piezoelectric layer has a configuration in which the KNN thin film containing Mn and exhibiting a small leakage current is in direct contact with at least one electrode layer of the first and second electrode layers and, thereby, a current barrier is formed and a leakage current can be reduced. In addition, it is considered that the KNN thin film substantially not containing Mn and exhibiting large piezoelectric characteristics is included and, thereby, degradation in the piezoelectric characteristics can be suppressed.

The piezoelectric element according to the present invention can contain at least one type of element selected from the group consisting of Li (lithium), Ba (barium), Sr (strontium), Ta (tantalum), and Zr (zirconium) in at least one of the first piezoelectric layer and the second piezoelectric layer. Consequently, the piezoelectric characteristics of the element can be further enhanced.

In the piezoelectric element according to the present invention, the content of Mn contained in the second piezoelectric layer can be 0.1 atomic percent or more and 5.0 atomic percent or less. In the case where the content of Mn is specified to be 0.1 atomic percent or more, the leakage current characteristic can be improved, and in the case where the content is specified to be 5.0 atomic percent or less, degradation in the piezoelectric characteristics can be suppressed.

In the piezoelectric element according to the present invention, the Na (sodium)/(Na+K (potassium)) ratio of the first piezoelectric layer can be 0.55 or more and 0.75 or less. In the case where the Na/(Na+K) ratio is specified to be 0.55 or more, the piezoelectric characteristics of the element can be enhanced, and in the case where the ratio is specified to be 0.75 or less, an increase in leakage current can be prevented.

The piezoelectric element according to the present invention can have a configuration in which the first piezoelectric layer is sandwiched between at least two layers of the second piezoelectric layer, and can have a configuration in which the first piezoelectric layer is disposed neither between the second piezoelectric layer and the first electrode layer nor between the second piezoelectric layer and the second electrode layer. According to this configuration, a leakage current of the element can be further reduced.

A piezoelectric actuator according to the present invention includes the piezoelectric element represented by the above-described configuration, and this piezoelectric element is provided with a plurality of potassium-sodium niobate thin films. Specific examples of piezoelectric actuators include a head assembly of a hard disc drive and a piezoelectric actuator of an ink-jet printer head.

Meanwhile, a piezoelectric sensor according to the present invention includes the piezoelectric element represented by the above-described configuration, and this piezoelectric element is provided with a plurality of potassium-sodium niobate thin films. Specific thin film piezoelectric sensors include a gyro sensor, a pressure sensor, and a pulse wave sensor.

In addition, in a hard disc drive and an ink-jet printer device according to the present invention, the above-described piezoelectric actuator is used.

The piezoelectric element according to the present invention can reduce a leakage current as compared with the piezoelectric element including the conventional KNN thin film, and the piezoelectric characteristics can be improved. Meanwhile, the piezoelectric actuator and the piezoelectric sensor according to the present invention can also reduce a leakage current and improve the piezoelectric characteristics. Therefore, high-performance hard disc drive and ink-jet printer device can be provided.

DESCRIPTION OF PREFERRED EXAMPLE

Figure 1:
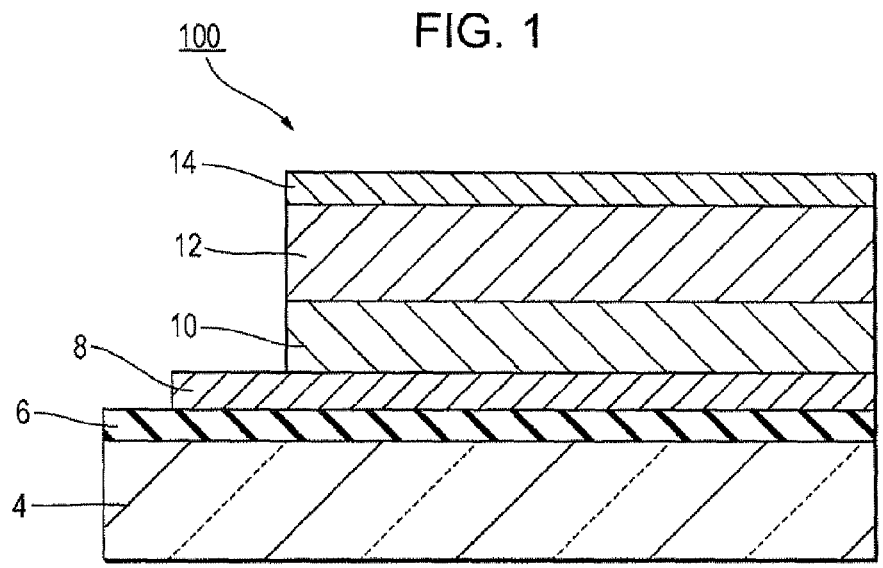
FIG. 1 is a configuration diagram of a piezoelectric element according to an embodiment of the present invention.

A preferred embodiment according to the present invention will be described below in detail with reference to the drawings. In this regard, in the drawings, the same or equivalent members are indicated by the same reference numerals. Meanwhile, vertical and horizontal relationships between positions are as shown in the drawing. In this connection, the same explanations will not be provided.

(Piezoelectric Element)

First embodiment

FIG. 1 shows a piezoelectric element 100 according to the present embodiment. The piezoelectric element 100 includes a substrate 4, an insulating layer 6 and a first electrode layer 8 disposed on the substrate 4, a first piezoelectric layer 10 disposed on the first electrode layer 8, a second piezoelectric layer 12 disposed on the first piezoelectric layer 10, and a second electrode layer 14 disposed on the second piezoelectric layer 12.

A silicon substrate exhibiting (100) surface orientation can be used as the substrate 4. The substrate 4 has, for example, a thickness of 50 μm or more and 1,000 μm or less. In addition, a silicon substrate exhibiting surface orientation different from a (100) plane, a Silicon on Insulator (SOI) substrate, a quartz glass substrate, a compound semiconductor substrate made from, for example, GaAs, a sapphire substrate, a metal substrate made from, for example, stainless steel, a MgO substrate, a $SrTiO_3$ substrate, or the like can also be used as the substrate 4.

The insulating layer 6 is used in the case where the substrate 4 is electrically conductive. A silicon thermal oxidation film ($SiO_2$), $Si_3N_4$, $ZrO_2$, $Y_2O_3$, ZnO, $Al_2O_3$, or the like can be used as the insulating layer 6. In the case where the substrate 4 does not have electrical conductivity, the insulating layer 6 may not be provided. The insulating layer 6 can be formed by a sputtering method, a vacuum evaporation method, a thermal oxidation method, a printing method, a spin coating method, a sol-gel method, or the like.

The first electrode layer 8 is formed from, for example, platinum (Pt). The first electrode layer 8 has a thickness of, for example, 0.02 μm or more and 1.0 μm or less. The first electrode layer 8 is formed from Pt and, thereby, the first piezoelectric layer 10 and the second piezoelectric layer 12, which have high orientation properties, can be formed. Also, a metal material, e.g., Pd (palladium), Rh (rhodium), Au (gold), Ru (ruthenium), Ir (iridium), Mo (molybdenum), Ti (titanium), or Ta (tantalum), or an electrically conductive metal oxide, e.g., $SrRuO_3$ or $LaNiO_3$, can be used as the first electrode layer 8. The first electrode layer 8 can be formed by the sputtering method, the vacuum evaporation method, the printing method, the spin coating method, the sol-gel method, or the like.

As for the material for the first piezoelectric layer 10, $(K a_x Na_{1-x})NbO_3$ (potassium-sodium niobate) substantially not containing Mn is used. The first piezoelectric layer 10 can be formed by the sputtering method, the vacuum evaporation method, the printing method, the spin coating method, the sol-gel method, or the like.

As for the material for the second piezoelectric layer 12, $(K a_y Na_{1-y})NbO_3$ (potassium-sodium niobate) containing Mn is used. The second piezoelectric layer 12 can be formed by the sputtering method, the vacuum evaporation method, the printing method, the spin coating method, the sol-gel method, or the like.

The leakage current of the element can be reduced and, in addition, degradation in the piezoelectric characteristics can be prevented by providing at least one layer each of first piezoelectric layer 10 which is made from a KNN thin film substantially not containing Mn and second piezoelectric layer 12 which is made from a KNN thin film containing Mn.

At least one of the first piezoelectric layer 10 and the second piezoelectric layer 12 can contain at least one type of element selected from the group consisting of Li, Ba, Sr, Ta, and Zr. The content of each of these elements can be 0.1 atomic percent or more and 5.0 atomic percent or less. Consequently, the piezoelectric characteristics of the element can be further enhanced.

The content of Mn contained in the second piezoelectric layer 12 can be 0.1 atomic percent or more and 5.0 atomic percent or less. In the case where the content of Mn contained in the second piezoelectric layer 12 is specified to be 0.1 atomic percent or more, the leakage current characteristic of the element can be improved, and in the case where the content is specified to be 5.0 atomic percent or less, degradation in the piezoelectric characteristics can be suppressed.

The Na/(Na+K) ratio of the first piezoelectric layer 10 can be 0.55 or more and 0.75 or less. In the case where the Na/(Na+K) ratio is specified to be 0.55 or more, the piezoelectric characteristics of the element can be enhanced, and in the case where the ratio is specified to be 0.75 or less, an increase in leakage current can be prevented.

A total of the film thicknesses of the first piezoelectric layer 10 and the second piezoelectric layer 12 is not specifically limited and can be, for example, about 0.5 to 10 μm.

The ratio, which is represented by the following Formula (1), of the film thickness of the first piezoelectric layer 10 to the film thickness of the second piezoelectric layer 12 (in the case where the layer includes a plurality of constituent layers, the ratio of the total thicknesses of the constituent layers) can be 1.0 or more and 10.0 or less.

film thickness ratio=film thickness of first piezoelectric layer (in the case of a plurality of layers, a total thereof)/film thickness of second piezoelectric layer (in the case of a plurality of layers, a total thereof) Formula (1)

The piezoelectric characteristics of the element can be enhanced and, in addition, an increase in leakage current can be suppressed by specifying the film thickness ratio to be 1.0 or more. Meanwhile, a leakage current of the element can be reduced and, in addition, degradation in the piezoelectric characteristics can be suppressed by specifying this film thickness ratio to be 10.0 or less.

The second electrode layer 14 is formed from, for example, platinum (Pt). The second electrode layer 14 has a thickness of, for example, 0.02 μm or more and 1.0 μm or less. Also, a metal material, e.g., Pd, Rh, Au, Ru, Ir, Mo, Ti, or Ta, or an electrically conductive metal oxide, e.g., $SrRuO_3$ or $LaNiO_3$, can be used as the second electrode layer 14. The second electrode layer 14 can be formed by the sputtering method, the vacuum evaporation method, the printing method, the spin coating method, the sol-gel method, or the like.

Meanwhile, the substrate 4 may be removed from the piezoelectric element 100. Consequently, the displacement and the sensitivity of the piezoelectric element 100 can be increased.

In addition, the piezoelectric element 100 may be coated with a protective film. Consequently, the reliability of the piezoelectric element 100 can be enhanced.

In the piezoelectric element 100, an intermediate layer may be provided between the electrode layers 8 and 14 and the piezoelectric layers. An electrically conductive oxide is used for this intermediate layer. In particular, $SrRuO_3$, $SrTiO_3$, $LaNiO_3$, $CaRuO_3$, $BaRuO_3$, $(La_xSr_{1-x})CoO_3$, $YBa_2Cu_3O_7$, $La_4BaCu_5O_{13}$, and the like are preferable because the electrical conductivity is high and the heat resistance is exhibited.

Meanwhile, it is preferable that the content of Mn contained in the second piezoelectric layer 12 of the piezoelectric element 100 decreases toward the first piezoelectric layer 10. In the case where this configuration is employed, the leakage current of the piezoelectric element 100 can be further reduced.

Furthermore, it is preferable that the piezoelectric element 100 contains Mn in the electrode layers 8 and 14 in contact with the second piezoelectric layer 12 or the intermediate layer. In the case where this configuration is employed, the leakage current of the piezoelectric element 100 can be further reduced.

Second Embodiment

Figure 2:
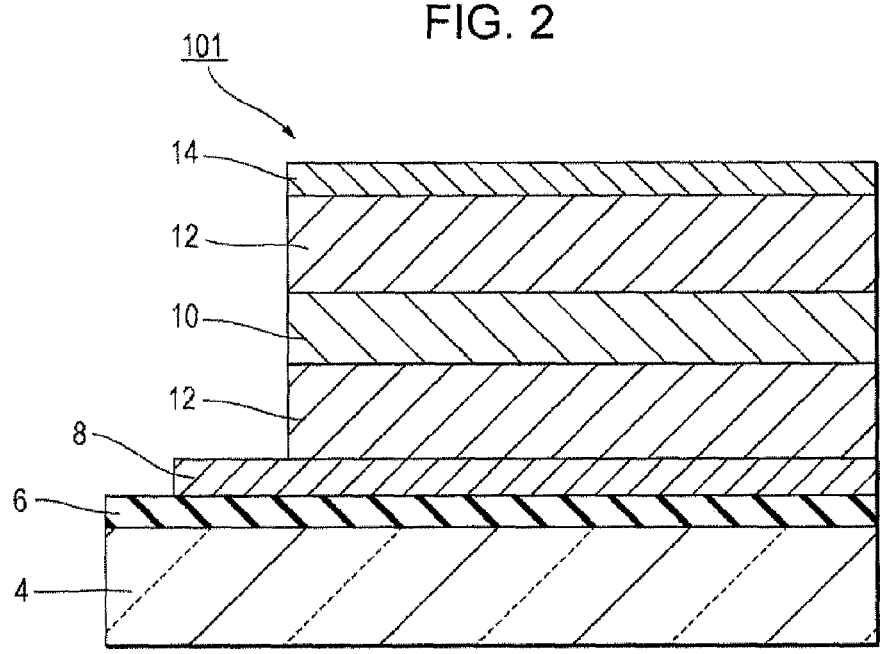
FIG. 2 is a configuration diagram of a piezoelectric element according to another embodiment of the present invention.

FIG. 2 shows a piezoelectric element 101 according to the present embodiment. The parts other than the first piezoelectric layer 10 and the second piezoelectric layer 12 are the same as those in the first embodiment. In the piezoelectric element 101, a piezoelectric layer has a configuration in which a first piezoelectric layer 10 is sandwiched between two second piezoelectric layers 12.

At least two layers of both the second piezoelectric layer 12 and the first piezoelectric layer 10 may be disposed. In that case, a configuration in which the first piezoelectric layer 10 is disposed neither between the second piezoelectric layer 12 and the first electrode layer 8 nor between the second piezoelectric layer 12 and the second electrode layer 14 can be employed. In the case where this configuration is employed, the leakage current of the piezoelectric element 101 can be reduced.

Up to this point, preferred embodiments of the piezoelectric element according to the present invention have been explained in detail, although the present invention is not limited to the above-described embodiments.

(Piezoelectric Actuator)

Figure 3A:
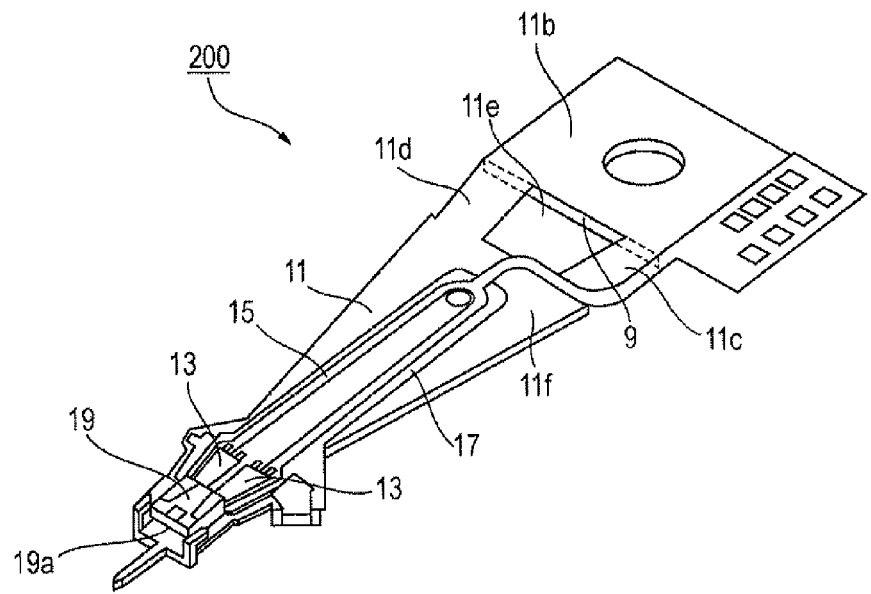
FIGS. 3A and 3B are structural diagrams of piezoelectric actuators according to the present invention.

FIG. 3A is a structural diagram of a head assembly mounted on a hard disc drive as an example of piezoelectric actuators including these piezoelectric elements. As shown in this drawing, a head assembly 200 includes a base plate 9, a load beam 11, a flexure 17, first and second piezoelectric elements 13 serving as driver elements, and a slider 19 provided with a head element 19a, as main constituents thereof.

In this regard, the load beam 11 includes a base end portion 11b fixed to the base plate 9 by beam welding or the like, first and second plate spring portions 11c and 11d extending from this base end portion 11b while tapering, an opening portion 11e disposed between the first and second plate spring portions 11c and 11d, and a beam main portion 11f following the first and second plate spring portions 11c and 11d and extending linearly while tapering.

The first and second piezoelectric elements 13 are disposed on a wiring flexible substrate 15 which is part of the flexure 17, while keeping a predetermined distance from each other. The slider 19 is fixed to an end portion of the flexure 17 and is rotated in accordance with expansion and contraction of the first and second piezoelectric elements 13.

The first and second piezoelectric elements 13 are formed from a first electrode layer, a second electrode layer, and a piezoelectric layer sandwiched between the first and second electrode layers. High withstand voltage and a sufficient displacement can be obtained by using the piezoelectric layer exhibiting a small leakage current and a large displacement, according to the present invention, as this piezoelectric layer.

Figure 3B:
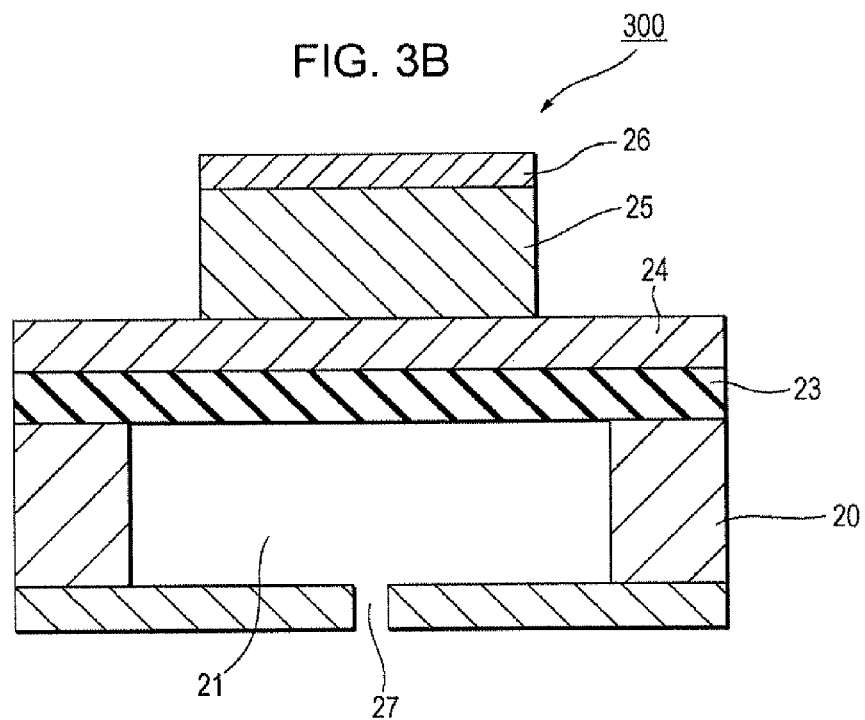

FIG. 3B is a configuration diagram of a piezoelectric actuator of an ink-jet printer head, as another example of the piezoelectric actuator including the above-described piezoelectric element.

A piezoelectric actuator 300 is formed by stacking an insulating layer 23, a lower electrode layer 24, a piezoelectric layer 25, and an upper electrode layer 26 on a substrate 20.

In the case where a predetermined ejection signal is not supplied and a voltage is not applied between the lower electrode layer 24 and the upper electrode layer 26, deformation does not occur in the piezoelectric layer 25. A pressure change does not occur in a pressure chamber 21 provided with a piezoelectric element supplied with no ejection signal, and an ink droplet is not ejected from a nozzle 27 thereof.

On the other hand, in the case where a predetermined ejection signal is supplied and a certain voltage is applied between the lower electrode layer 24 and the upper electrode layer 26, deformation occurs in the piezoelectric layer 25. The insulating film 23 is bent to a great extent in a pressure chamber 21 provided with the piezoelectric element supplied with an ejection signal. Consequently, the pressure in the pressure chamber 21 increases instantaneously, and an ink droplet is ejected from the nozzle 27.

Here, high withstand voltage and a sufficient displacement can be obtained by using the piezoelectric layer exhibiting a small leakage current and a large displacement, according to the present invention, as the piezoelectric layer.

(Piezoelectric Sensor)

Figure 4A:
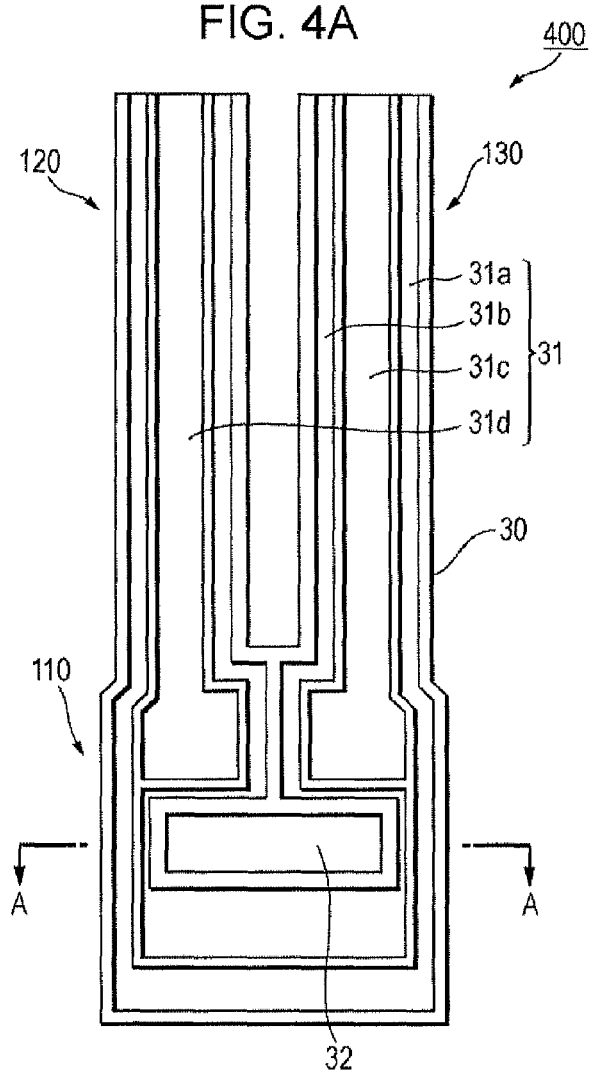
FIGS. 4A to 4D are structural diagrams of piezoelectric sensors according to the present invention.
Figure 4B:
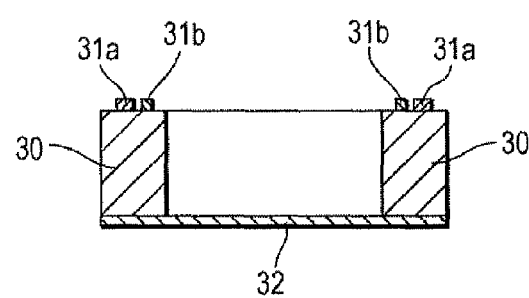

FIG. 4A is a structural diagram (plan view) of a gyro sensor as an example of a piezoelectric sensor including the above-described piezoelectric element. FIG. 4B is a sectional view of the section taken along a line A-A shown in FIG. 4A.

A gyro sensor 400 is a tuning fork vibrator type angular velocity detecting element provided with a base portion 110 and two arms 120 and 130 connected to one surface of the base portion 110. This gyro sensor 400 is obtained by micromachining the piezoelectric layer 30, the upper electrode layer 31, and the lower electrode layer 32 constituting the above-described piezoelectric element to correspond with the shape of the tuning fork vibrator. The individual portions (base portion 110 and arms 120 and 130) are integrally formed by the piezoelectric element.

Each of drive electrode layers 31a and 31b and detection electrode layer 31d is disposed on a first principal surface of one arm 120. Likewise, each of drive electrode layers 31a and 31b and detection electrode layer 31c is disposed on a first principal surface of the other arm 130. Each of these electrode layers 31a, 31b, 31c, and 31d is obtained by etching the upper electrode layer 31 into a predetermined electrode shape.

Meanwhile, the lower electrode layer 32 disposed all over second principal surfaces (principal surface on the back side of the first principal surface) of the base portion 110 and the arms 120 and 130 functions as a ground electrode of the gyro sensor 400.

Here, the longitudinal direction of each of the arms 120 and 130 is specified to be a Z direction, and a plane including the principal surfaces of the two arms 120 and 130 is specified to be an XZ plane, so that an XYZ rectangular coordinate system is defined.

When a drive signal is supplied to the drive electrode layers 31a and 31b, the two arms 120 and 130 are excited in an in-plane vibration mode. The in-plane vibration mode refers to a vibration mode in which the two arms 120 and 130 are excited in a direction parallel to the principal surfaces of the two arms 120 and 130. For example, when one arm 120 is excited in a −X direction at a velocity V1, the other arm 130 is excited in a +X direction at a velocity V2.

In the case where rotation at an angular velocity ω is added to the gyro sensor 400 under this state while the axis of rotation is specified to be the Z axis, the Coriolis force is applied to each of the two arms 120 and 130 in a direction orthogonal to the direction of the velocity, and excitation occurs in an out-of-plane vibration mode. The out-of-plane vibration mode refers to a vibration mode in which the two arms 120 and 130 are excited in a direction orthogonal to the principal surfaces of the two arms 120 and 130. For example, when the Coriolis force F1 applied to one arm 120 is in a −Y direction, a Coriolis force F2 applied to the other arm 130 is in a +Y direction.

The magnitudes of the Coriolis forces F1 and F2 are proportionate to the angular velocity ω and, therefore, the angular velocity ω can be determined by converting mechanical strains of the arms 120 and 130 due to the Coriolis forces F1 and F2 to electric signals (detection signals) by the piezoelectric layer 30 and taking them from the detection electrode layers 31c and 31d.

High withstand voltage and sufficient detection sensitivity can be obtained by using the piezoelectric layer exhibiting a small leakage current and a large displacement, according to the present invention, as this piezoelectric layer.

Figure 4C:
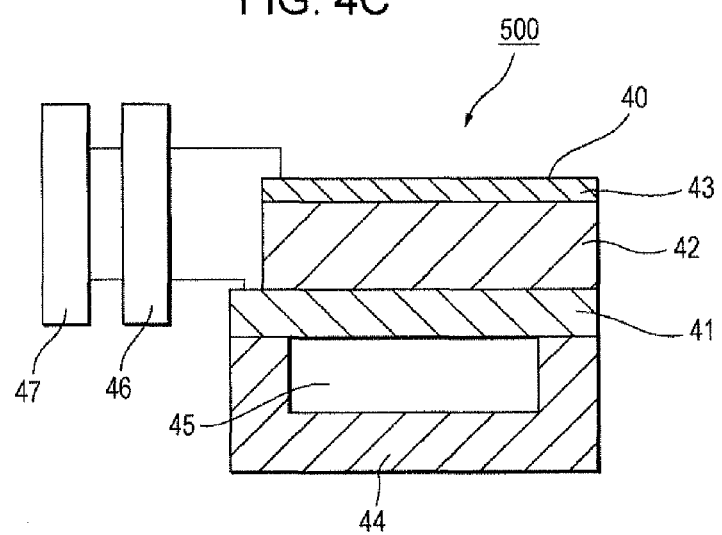

FIG. 4C is a configuration diagram of a pressure sensor as a second example of the piezoelectric sensor including the above-described piezoelectric element.

A pressure sensor 500 has a cavity 45 to respond to application of a pressure and, in addition, is formed from a support member 44 to support a piezoelectric element 40, a current amplifier 46, and a voltage measuring instrument 47. The piezoelectric element 40 includes a common electrode layer 41, a piezoelectric layer 42, and an individual electrode layer 43, which are stacked in that order on the support member 44. Here, when an external force is applied, the piezoelectric element 40 is bent and the voltage is detected by the voltage measuring instrument 47.

High withstand voltage and sufficient detection sensitivity can be obtained by using the piezoelectric layer exhibiting a small leakage current and a large displacement, according to the present invention, as this piezoelectric layer.

Figure 4D:
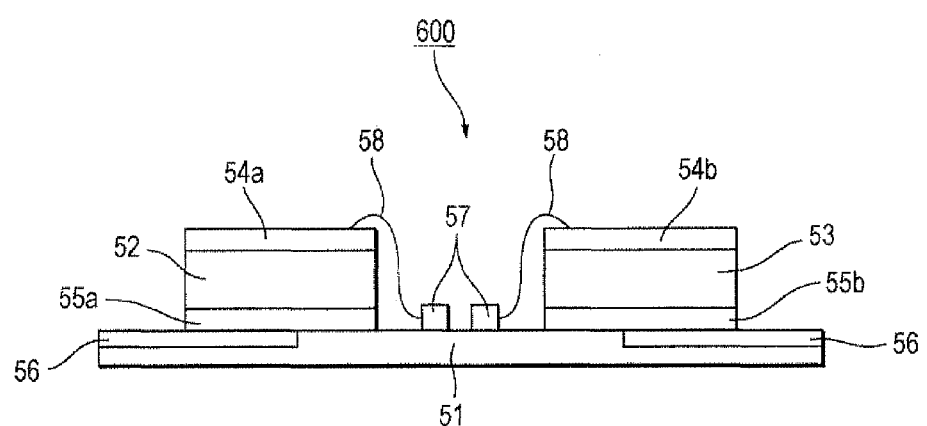

FIG. 4D is a configuration diagram of a pulse wave sensor as a third example of the piezoelectric sensor including the above-described piezoelectric element.

A pulse wave sensor 600 is configured to be equipped with a transmitting piezoelectric element and a receiving piezoelectric element on a substrate 51. Here, in the transmitting piezoelectric element, electrode layers 54a and 55a are disposed on the two surfaces of the transmitting piezoelectric layer 52 in the thickness direction, and in the receiving piezoelectric element, electrode layers 54b and 55b are also disposed on the two surfaces of the receiving piezoelectric layer 53 in the thickness direction. In addition, electrodes 56 and upper surface electrodes 57 are disposed on the substrate 51, where the electrode layers 54b and 55b are electrically connected to the upper surface electrodes 57, respectively, by wirings.

In order to detect pulses of a living body, initially, the substrate back surface (surface not equipped with the piezoelectric element) of the pulse wave sensor 600 is brought into contact with the living body. Then, when pulses are detected, a specific drive voltage signal is output to both the electrode layers 54a and 55a of the transmitting piezoelectric element. The transmitting piezoelectric element is excited in accordance with the drive voltage signal input into both the electrode layers 54a and 55a, so as to generate an ultrasonic wave and transmit the ultrasonic wave into the living body. The ultrasonic wave transmitted into the living body is reflected by a bloodstream and is received by the receiving piezoelectric element. The receiving piezoelectric element converts the received ultrasonic wave to a voltage signal and outputs from both the electrode layers 54b and 55b.

High withstand voltage and sufficient detection sensitivity can be obtained by using the piezoelectric layer exhibiting a small leakage current and a large displacement, according to the present invention, as both the piezoelectric layers.

(Hard Disk Drive)

Figure 5:
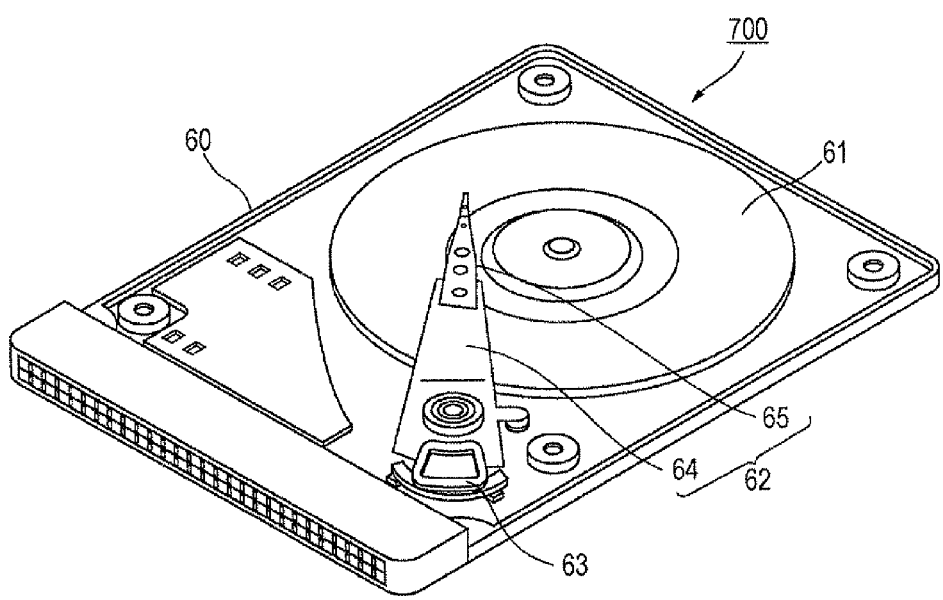
FIG. 5 is a structural diagram of a hard disc drive according to the present invention.

FIG. 5 is a configuration diagram of a hard disk drive equipped with the head assembly shown in FIG. 3A.

A hard disk drive 700 is provided with a hard disk 61 serving as a recording medium and a head stack assembly 62 to record the magnetic information thereto and regenerate in a housing 60. The hard disk 61 is rotated by a motor, although not shown in the drawing.

In the head stack assembly 62, a plurality of assemblies formed from an actuator arm 64 supported by a voice coil motor 63 in such a way as to rotate freely around a spindle and a head assembly 65 connected to this actuator arm 64 are stacked in the depth direction in the drawing. The head slider 19 is attached to an end portion of the head assembly 65 in such a way as to opposite to the hard disk 61 (refer to FIG. 3A).

As for the head assembly 65, a form in which the head element 19a (refer to FIG. 3A) is fluctuated in two steps is adopted. Relatively large movements of the head element 19a are controlled by whole drive of the head assembly 65 and the actuator aim 64 on the basis of the voice coil motor 63, and fine movements are controlled by drive of the head slider 19 by the end portion of the head assembly 65.

High withstand voltage and sufficient accessibility can be obtained by using the piezoelectric layer exhibiting a small leakage current and a large displacement, according to the present invention, as the piezoelectric layer in this piezoelectric element used for this head assembly 65.

(Ink Jet Printer Device)

Figure 6:
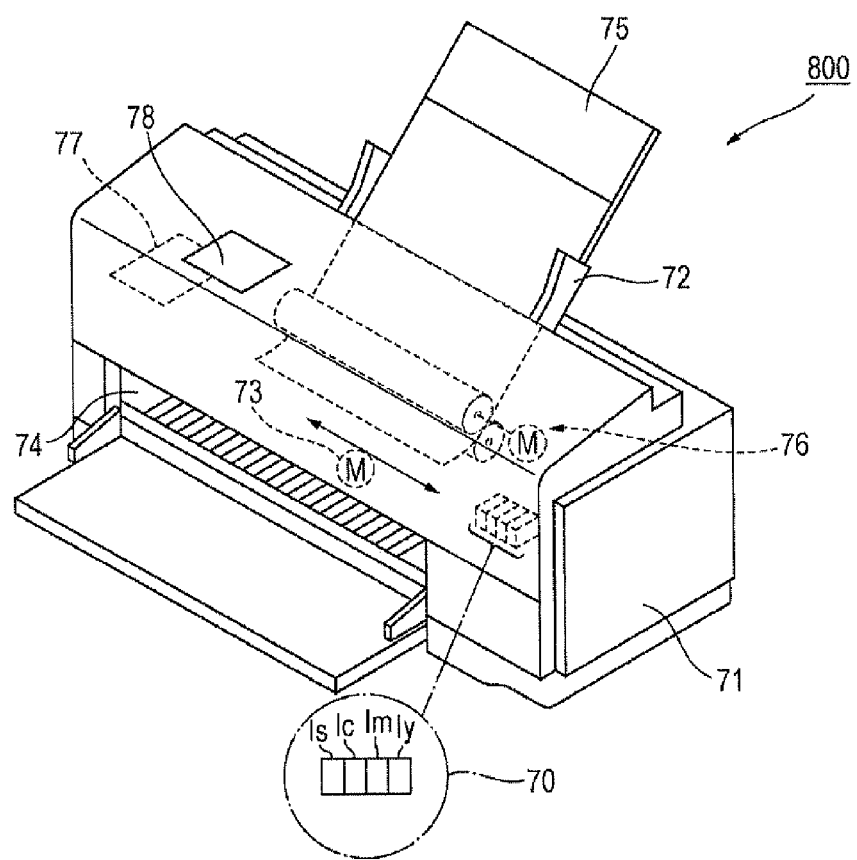
FIG. 6 is a structural diagram of an ink-jet printer device according to the present invention.

FIG. 6 is a configuration diagram of an ink-jet printer device equipped with the ink-jet printer head shown in FIG. 3B.

An ink-jet printer device 800 is configured to primarily include an ink-jet printer head 70, a main body 71, a tray 72, and a head drive mechanism 73.

The ink-jet printer device 800 is provided with ink cartridges of four colors of yellow, magenta, cyan, and black in total and is configured to be able to perform full color printing. In addition, this ink-jet printer device 800 is provided with an exclusive controller board and the like in the inside, and the ink ejection timing of the ink-jet printer head 70 and scanning of the head drive mechanism 73 are controlled. Meanwhile, the main body 71 is provided with the tray 72 on the back and is provided with an automatic sheet feeder (automatic continuous sheet feeding mechanism) 76 in the inside, so as to automatically send recording paper 75 and deliver the recording paper 75 from a front-mounted delivery port 74.

An ink-jet printer device having high withstand voltage and high safety can be provided by using the piezoelectric layer exhibiting a small leakage current and a large displacement, according to the present invention, as this piezoelectric layer in the piezoelectric element used for the piezoelectric actuator of this ink-jet printer head 70.

EXAMPLES

The present invention will be more specifically described below with reference to the examples and the comparative examples. However, the present invention is not limited to the following examples.

(Production of Piezoelectric Element)

Example 1

In the present example, a term "base member" refers to a member to be provided with a film in each step.

A silicon wafer (substrate 4) which was provided with a thermal oxidation film ($SiO_2$: insulating layer 6) and which had a diameter of 3 inches was placed in a vacuum chamber of a RF sputtering apparatus, evacuation was performed and, thereafter, a film of Pt was formed as a first electrode layer 8. The base member temperature in film formation was specified to be 400° C. and the thickness of the first electrode layer 8 was specified to be 200 nm.

Subsequently, the base member was transferred to a chamber of a RF sputtering apparatus equipped with a plurality of sputtering targets, evacuation was performed and, thereafter, a $(K_{0.5}Na_{0.5})NbO_3$ thin film was formed as a first piezoelectric layer 10. As for a sputtering target, a $(K_{0.5}Na_{0.5})NbO_3$ sintered material was used. The base member temperature in film formation was specified to be 550° C. and the thickness of the first piezoelectric layer 10 was specified to be 1,500 nm.

Then, in the same chamber, the sputtering target was changed, and a $(K_{0.5}Na_{0.5})NbO_3$ thin film containing 2.0 atomic percent of Mn was formed as a second piezoelectric layer 12. As for a sputtering target, a $(K_{0.5}Na_{0.5})NbO_3$ sintered material containing 2.0 atomic percent of Mn was used. Manganese was added in such a way that the whole sintered material became 100 atomic percent. The same goes for the other additives described below. The base member temperature in film formation was specified to be 550° C. and the thickness of the second piezoelectric layer 12 was specified to be 500 nm. The composition of the piezoelectric layers became almost the same as the composition of the respective sputtering targets.

Thereafter, the base member was transferred again to another chamber of the RF sputtering apparatus, evacuation was performed and, then, a film of Pt was formed as a second electrode layer 14. The base member temperature in film formation was specified to be 200° C. and the thickness of the second electrode layer 14 was specified to be 200 nm.

After the second electrode layer 14 was formed, a laminate including the piezoelectric layer was patterned by photolithography and dry etching, wet etching, and the wafer was subjected to cutting work, so as to obtain a piezoelectric element 100 having a movable part dimension of 5 mm×20 mm.

Table 1 shows the primary components, additives and the contents thereof, and the film thicknesses of each of the first piezoelectric layer 10 and the second piezoelectric layer 12 in the present example. In addition, Table 1 shows the stacking structure of the piezoelectric element 100 and the film thickness ratio of the first piezoelectric layer 10 to the second piezoelectric layer 12 determined from Formula (1) described above.

Comparative Example 1

In Example 1, after the first electrode layer 8 was formed, the base member was transferred to another chamber of the RF sputtering apparatus. Evacuation was performed and, subsequently, a $(K_{0.5}Na_{0.5})NbO_3$ thin film was formed as a single-layer piezoelectric layer. As for a sputtering target, a $(K_{0.5}Na_{0.5})NbO_3$ sintered material was used. The base member temperature in film formation was specified to be 550° C. and the thickness of the piezoelectric layer was specified to be 2,000 nm.

A piezoelectric element of Comparative example 1 was produced, where the element configuration and the production steps were the same as those in Example 1 except the piezoelectric layer.

Comparative Example 2

As for the piezoelectric layer, a single-layer $(K_{0.5}Na_{0.5})NbO_3$ thin film containing 2.0 atomic percent of Mn was used. A piezoelectric element of Comparative example 2 was produced, where the element configuration and the production steps were the same as those in Comparative example 1 except the piezoelectric layer.

Comparative Example 3

As for the piezoelectric layer, a single-layer $(K_{0.5}Na_{0.5})NbO_3$ thin film containing 1.0 atomic percent of each of Li, Ba, Sr, Ta, and Zr was used. A piezoelectric element of Comparative example 3 was produced, where the element configuration and the production steps were the same as those in Comparative example 1 except the piezoelectric layer.

Comparative Example 4

As for the piezoelectric layer, a single-layer $(K_{0.5}Na_{0.5})NbO_3$ thin film containing 2.0 atomic percent of Mn and 1.0 atomic percent of each of Li, Ba, Sr, Ta, and Zr was used. A piezoelectric element of Comparative example 4 was produced, where the element configuration and the production steps were the same as those in Comparative example 1 except the piezoelectric layer.

Examples 2 to 10

The materials shown in Table 1 were used as sputtering targets, and a first piezoelectric layer 10 and a second piezoelectric layer 12 were formed. Piezoelectric elements 100 of Examples 2 to 10 were produced, where other element configurations and the production steps were the same as those in Example 1.

Examples 11 to 22

The composition of the sputtering target was adjusted in such a way that the content of Mn added to a second piezoelectric layer 12 became the value shown in Table 1. Piezoelectric elements 100 of Examples 11 to 22 were produced, where other element configurations and the production steps were the same as those in Example 10.

Examples 23 to 29

The composition of the sputtering target was adjusted in such a way that the values of x and y in $(K_xNa_{2-x})NbO_3$ and $(K_yNa_{1-y})NbO_3$ used for the first piezoelectric layer 10 and the second piezoelectric layer 12 became the values shown in Table 1. Piezoelectric elements 100 of Examples 23 to 29 were produced, where other element configurations and the production steps were the same as those in Example 10.

Example 30

In Example 1, the first electrode layer 8 was formed. Subsequently, the base member was transferred to a chamber of a RF sputtering apparatus equipped with a plurality of sputtering targets, evacuation was performed and, thereafter, a $(K_{0.44}Na_{0.56})NbO_3$ thin film containing Mn was formed as a second piezoelectric layer 12. As for a sputtering target, a $(K_{0.44}Na_{0.56})NbO_3$ sintered material containing 2.0 atomic percent of Mn was used. The base member temperature in film formation was specified to be 550° C. and the thickness of the second piezoelectric layer 12 was specified to be 250 nm.

Then, in the same chamber, the sputtering target was changed, and a $(K_{0.44}Na_{0.56})NbO_3$ thin film was formed as a first piezoelectric layer 10. As for a sputtering target, a $(K_{0.44}Na_{0.56})NbO_3$ sintered material was used. The base member temperature in film formation was specified to be 550° C. and the thickness of the first piezoelectric layer 10 was specified to be 1,500 nm.

Subsequently, in the same chamber, the sputtering target was changed, and a $(K_{0.44}Na_{0.56})NbO_3$ thin film containing Mn was formed as a second piezoelectric layer 12. As for a sputtering target, a $(K_{0.44}Na_{0.56})NbO_3$ sintered material containing 2.0 atomic percent of Mn was used. The base member temperature in film formation was specified to be 550° C. and the thickness of the second piezoelectric layer 12 was specified to be 250 nm.

Thereafter, the base member was transferred again to another chamber of the RF sputtering apparatus, evacuation was performed and, then, a film of Pt was formed as a second electrode layer 14. The base member temperature in film formation was specified to be 200° C. and the thickness of the second electrode layer 14 was specified to be 200 nm.

Piezoelectric element 101 of Example 30 was produced, where other element configurations and the production steps were the same as those in Example 10.

Examples 31 to 39

Piezoelectric elements 101 of Examples 31 to 39 were produced in the same manner as in Example 30 except that the film thicknesses were specified in such a way as to allow the film thickness ratios of the first piezoelectric layer 10 to the second piezoelectric layer 12 to become the values shown in Table 1.

Example 40

Figure 7:
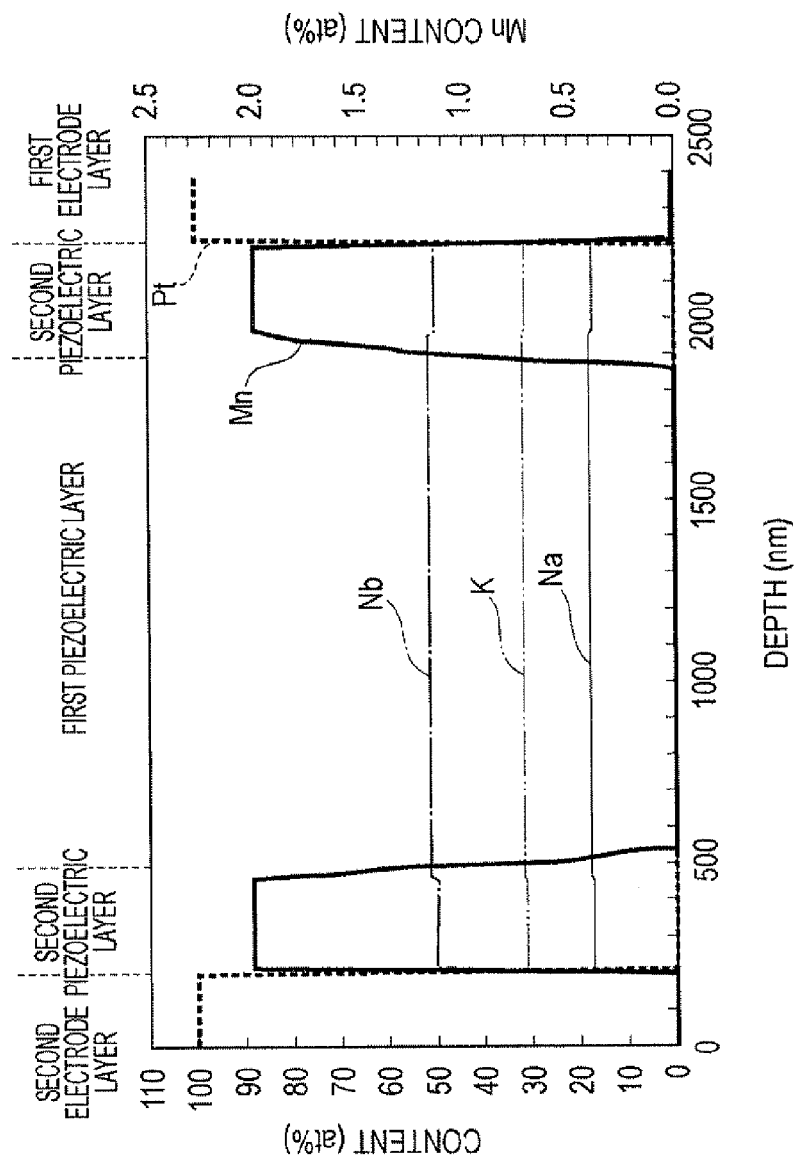
FIG. 7 is an Auger electron microscopic profile in an example according to another embodiment of the present invention.

In production of a piezoelectric element 101 similar to the piezoelectric element 101 in Example 30, the second electrode layer 14 was formed and, thereafter, the laminate was heat-treated in the air. The heat treatment was performed at 300° C. for 1 hour. A piezoelectric element 101 of Example 40 was produced, where the steps were the same as in Example 30 except the heat treatment. After the heat treatment, part of the laminate was cut, and the profile of the content of Mn contained in the piezoelectric element 101 made from the first electrode layer 8, the first piezoelectric layer 10, the second piezoelectric layer 12, and the second electrode layer 14 in the film thickness direction was analyzed by Auger Electron Microscopy. FIG. 7 shows the content profiles of Mn and other main constituent metal elements in the depth direction. It was ascertained that the content of Mn contained in the second piezoelectric layer 12 decreased toward the first piezoelectric layer 10 in the vicinity of the interface between the first piezoelectric layer 10 and the second piezoelectric layer 12.

Example 41

Figure 8:
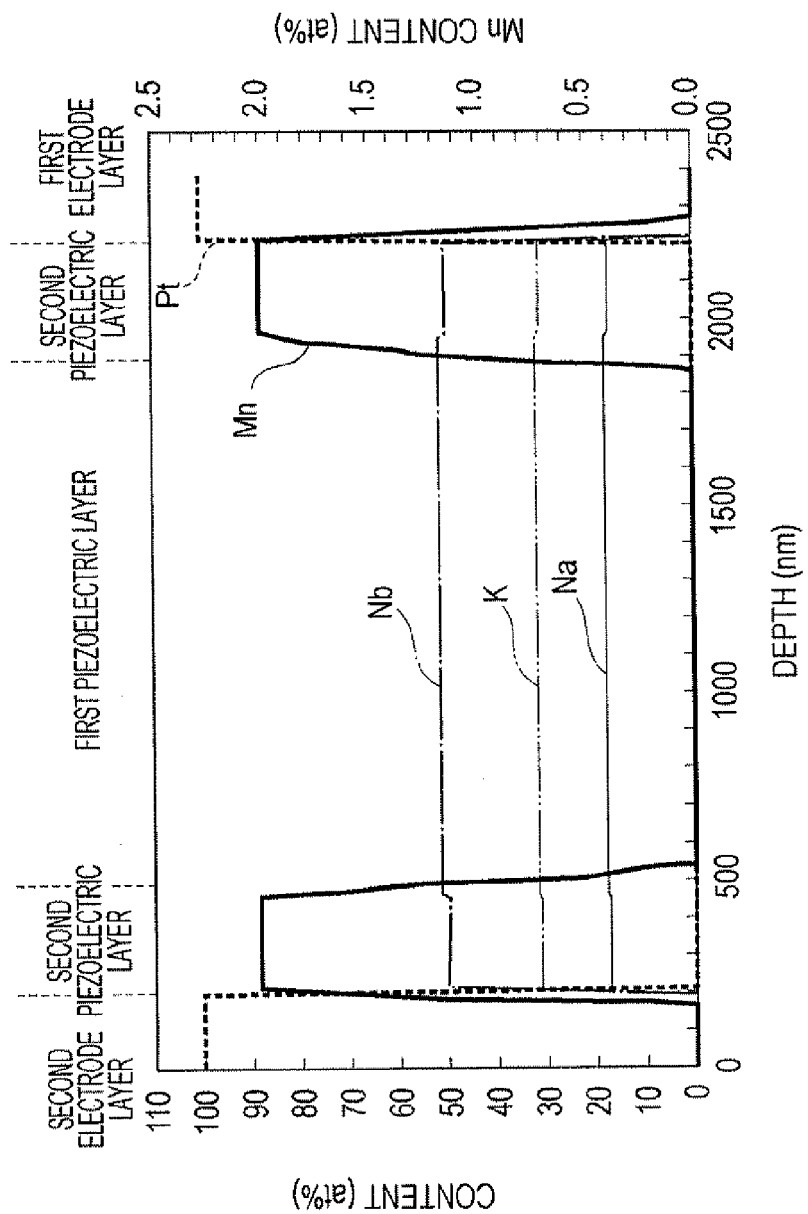
FIG. 8 is an Auger electron microscopic profile in another example according to another embodiment of the present invention.

In production of a piezoelectric element 101 similar to the piezoelectric element 101 in Example 30, the second electrode layer 14 was formed and, thereafter, the laminate was heat-treated in the air. The heat treatment was performed at 700° C. for 1 hour. A piezoelectric element 101 of Example 41 was produced, where the steps were the same as in Example 30 except the heat treatment. After the heat treatment, part of the laminate was cut, and the profile of the content of Mn contained in the piezoelectric element 101 including the first electrode layer 8, the first piezoelectric layer 10, the second piezoelectric layer 12, and the second electrode layer 14 in the film thickness direction was analyzed by Auger Electron Microscopy. FIG. 8 shows the content profiles of Mn and other main constituent metal elements in the depth direction. It was ascertained that the content of Mn contained in the second piezoelectric layer 12 decreased toward the first piezoelectric layer 10 in the vicinity of the interface between the first piezoelectric layer 10 and the second piezoelectric layer 12. In addition, it was ascertained that Mn was contained in the first electrode layer 8 and the second electrode layer 14 in the vicinity of the interfaces to the second piezoelectric layers 12.

(Evaluation of Piezoelectric Element)

The leakage current density of each piezoelectric element of Examples 1 to 41 and Comparative examples 1 to 4 was evaluated by using a ferroelectric substance evaluation system TF-1000 (produced by aixACCT). The applied voltage was specified to be ±20 V and measurements were performed in steps of 2 V for 2 seconds. Table 2 shows the absolute values of maximum leakage current densities obtained by the measurements. Furthermore, the displacement when a voltage was applied to each piezoelectric element was measured by using a lased Doppler vibrograph (produced by Graphtec Corporation). Table 2 shows the values of displacements measured by applying a voltage of sinusoidal wave (±3 V or ±20 V) with a frequency of 1 kHz, where the first electrode layer was connected to a positive electrode and the second electrode layer was connected to a negative electrode.

It was ascertained that the displacements due to application of ±20 V of the piezoelectric elements in Examples 1 to 41 including the first electrode layer 8, the second electrode layer 14, and the piezoelectric layer sandwiched between the above-described first electrode layer and second electrode layer, wherein the piezoelectric layer was provided with at least one layer each of first piezoelectric layer 10 which was a potassium-sodium niobate thin film substantially not containing Mn and second piezoelectric layer 12 which was a potassium-sodium niobate thin film containing Mn, were larger than those of the piezoelectric elements in Comparative examples 1 to 4 not provided with this factor.

The leakage current of the piezoelectric element in Comparative example 2 was smaller than that of the piezoelectric elements in some Examples, but it was ascertained that the displacement was small and, therefore, was impractical.

It was ascertained that the displacements due to application of ±20 V of the piezoelectric elements in Examples 2 to 41, in which at least one type of element selected from the group consisting of Li, Ba, Sr, Ta, and Zr was contained in at least one of the first piezoelectric layer 10 and the second piezoelectric layer 12, were larger than the displacements of the piezoelectric element 100 in Example 1 not provided with this factor.

It was ascertained that the displacement due to application of ±20 V of the piezoelectric element 100 in Example 10, in which at least one type of element selected from the group consisting of Li, Ba, Sr, Ta, and Zr was contained in both the first piezoelectric layer 10 and the second piezoelectric layer 12, was larger than the displacements of the piezoelectric elements 100 in Examples 2 to 9 produced in the same manner except that the above-described element was contained in only the first piezoelectric layer 10.

It was ascertained that the displacements due to application of ±20 V of the piezoelectric elements 100 in Examples 12 to 20, in which the content of Mn contained in the second piezoelectric layer 12 was 0.1 atomic percent or more and 5.0 atomic percent or less, were larger than the displacements of the piezoelectric elements 100 in Examples 11, 21, and 22 produced in the same manner except that this factor was not provided.

It was ascertained that the displacements due to application of ±20 V of the piezoelectric elements 100 in Examples 25 to 28, in which the Na/(Na+K) ratios of the first piezoelectric layer 10 were 0.55 or more and 0.75 or less, were larger than the displacements of the piezoelectric elements 100 in Examples 23, 24, and 29 produced in the same manner except that this factor was not provided.

It was ascertained that the displacement due to application of ±20 V of the piezoelectric element 101 in Example 30, wherein the piezoelectric layer had a configuration in which the first piezoelectric layer 10 was sandwiched between at least two layers of the second piezoelectric layers 12 and had a configuration in which the first piezoelectric layer 10 was disposed neither between the second piezoelectric layer 12 and the first electrode layer 8 nor between the second piezoelectric layer 12 and the second electrode layer 14, was larger than the displacements of the piezoelectric elements 100 in Examples 1 to 29 produced in the same manner except that this factor was not provided.

It was ascertained that the displacements due to application of ±20 V of the piezoelectric elements 101 in Example 30 and Examples 33 to 37, in which the ratios of the total film thickness of the first piezoelectric layer 10 to the total film thickness of the second piezoelectric layer 12 were specified to be 1 or more and 10 or less, were larger than the displacements of the piezoelectric elements 101 in Examples 31, 32, 38, and 39 produced in the same manner except that this factor was not satisfied.

It was ascertained that the displacement due to application of ±20 V of the piezoelectric element 101 in Example 40, in which the content of Mn contained in the second piezoelectric layer 12 decreased toward the first piezoelectric layer 10, was larger than the displacement of the piezoelectric elements 101 in Example 30 produced in the same manner except that this factor was not satisfied.

It was ascertained that the displacement due to application of ±20 V of the piezoelectric element 101 in Example 41, in which Mn is contained in the first electrode layer 8 and the the second electrode layer 14, was larger than the displacement of the piezoelectric element 101 in Example 40 produced in the same manner except that this factor was not satisfied.

The piezoelectric element according to the present invention is formed from the first electrode layer, the second electrode layer, and the piezoelectric layer sandwiched between the first and second electrode layers. In the case where this piezoelectric layer exhibiting a small leakage current and a large displacement is used as the piezoelectric layer of the piezoelectric actuator, high withstand voltage and a sufficient displacement can be obtained.

Meanwhile, high withstand voltage and sufficient detection sensitivity can be obtained by using the piezoelectric layer exhibiting a small leakage current and a large displacement, according to the present invention, as the piezoelectric layer of the pressure sensor.

High voltage resistance and sufficient accessibility can be obtained by using the piezoelectric layer exhibiting a small leakage current and a large displacement, according to the present invention, as the piezoelectric layer in the piezoelectric element used for the head assembly of the hard disc drive.

In addition, an ink-jet printer device having high withstand voltage and high safety can be provided by using the piezoelectric layer exhibiting a small leakage current and a large displacement, according to the present invention, as the piezoelectric layer in the piezoelectric element used for the piezoelectric actuator of the ink-jet printer head.

TABLE 1

| | | First piezoelectric layer | | | | Second piezoelectric layer | | | | | |
| | | | Additive | | Film thickness (nm) | | Additive | | Film thickness (nm) | Stacking structure | Film thickness ratio |
| | Primary component | | Element | Content (at %) | | Primary component | | Element | Content (at %) | | |
|---|---|---|---|---|---|---|---|---|---|---|---|
| Example 1 | $(K_{1-x}Na_x)NbO_3$ $x = 0.50$ | 1 2 3 4 5 6 | — — — — — — | — — — — — — | 1500 | $(K_{1-x}Na_x)NbO_3$ $x = 0.50$ | 1 2 3 4 5 6 | Mn — — — — — | 2.0 — — — — — | 500 | Second electrode layer/ Second plezoelectric layer/First piezoelectric layer/First electrode layer/Substrate | 3.0 |
| Example 2 | $(K_{1-x}Na_x)NbO_3$ $x = 0.50$ | 1 2 3 4 5 6 | Li — — — — — | 1.0 — — — — — | 1500 | $(K_{1-x}Na_x)NbO_3$ $x = 0.50$ | 1 2 3 4 5 6 | Mn — — — — — | 2.0 — — — — — | 500 | Second electrode layer/ Second plezoelectric layer/First piezoelectric layer/First electrode layer/Substrate | 3.0 |
| Example 3 | $(K_{1-x}Na_x)NbO_3$ $x = 0.50$ | 1 2 3 4 5 6 | Ba — — — — — | 1.0 — — — — — | 1500 | $(K_{1-x}Na_x)NbO_3$ $x = 0.50$ | 1 2 3 4 5 6 | Mn — — — — — | 2.0 — — — — — | 500 | Second electrode layer/ Second plezoelectric layer/First piezoelectric layer/First electrode layer/Substrate | 3.0 |
| Example 4 | $(K_{1-x}Na_x)NbO_3$ $x = 0.50$ | 1 2 3 4 5 6 | Sr — — — — — | 1.0 — — — — — | 1500 | $(K_{1-x}Na_x)NbO_3$ $x = 0.50$ | 1 2 3 4 5 6 | Mn — — — — — | 2.0 — — — — — | 500 | Second electrode layer/ Second plezoelectric layer/First piezoelectric layer/First electrode layer/Substrate | 3.0 |
| Example 5 | $(K_{1-x}Na_x)NbO_3$ $x = 0.50$ | 1 2 3 4 5 6 | Ta — — — — — | 1.0 — — — — — | 1500 | $(K_{1-x}Na_x)NbO_3$ $x = 0.50$ | 1 2 3 4 5 6 | Mn — — — — — | 2.0 — — — — — | 500 | Second electrode layer/ Second plezoelectric layer/First piezoelectric layer/First electrode layer/Substrate | 3.0 |
| Example 6 | $(K_{1-x}Na_x)NbO_3$ $x = 0.50$ | 1 2 3 4 5 6 | Zr — — — — — | 1.0 — — — — — | 1500 | $(K_{1-x}Na_x)NbO_3$ $x = 0.50$ | 1 2 3 4 5 6 | Mn — — — — — | 2.0 — — — — — | 500 | Second electrode layer/ Second plezoelectric layer/First piezoelectric layer/First electrode layer/Substrate | 3.0 |
| Example 7 | $(K_{1-x}Na_x)NbO_3$ $x = 0.50$ | 1 2 3 4 5 6 | Li Sr Ta — — — | 1.0 1.0 1.0 — — — | 1500 | $(K_{1-x}Na_x)NbO_3$ $x = 0.50$ | 1 2 3 4 5 6 | Mn — — — — — | 2.0 — — — — — | 500 | Second electrode layer/ Second plezoelectric layer/First piezoelectric layer/First electrode layer/Substrate | 3.0 |
| Example 8 | $(K_{1-x}Na_x)NbO_3$ $x = 0.50$ | 1 2 3 4 5 6 | Sr Ta Zr — — — | 1.0 1.0 1.0 — — — | 1500 | $(K_{1-x}Na_x)NbO_3$ $x = 0.50$ | 1 2 3 4 5 6 | Mn — — — — — | 2.0 — — — — — | 500 | Second electrode layer/ Second plezoelectric layer/First piezoelectric layer/First electrode layer/Substrate | 3.0 |
| Example 9 | $(K_{1-x}Na_x)NbO_3$ $x = 0.50$ | 1 2 | Li Ba | 1.0 1.0 | 1500 | $(K_{1-x}Na_x)NbO_3$ $x = 0.50$ | 1 2 | Mn — | 2.0 — | 500 | Second electrode layer/ Second plezoelectric | 3.0 |

TABLE 1-continued

| | First piezoelectric layer | | | | Second piezoelectric layer | | | | | |
|---|---|---|---|---|---|---|---|---|---|---|
| | | Additive | | Film thickness (nm) | | Additive | | Film thickness (nm) | Stacking structure | Film thickness ratio |
| | Primary component | Element | Content (at %) | | Primary component | Element | Content (at %) | | | |
| | | 3 Sr | 1.0 | | | 3 — | — | | layer/First piezoelectric | |
| | | 4 Ta | 1.0 | | | 4 — | — | | layer/First electrode | |
| | | 5 Zr | 1.0 | | | 5 — | — | | layer/Substrate | |
| | | 6 — | — | | | 6 — | — | | | |
| Example 10 | $(K_{1-x}Na_x)NbO_3$ x = 0.50 | 1 Li | 1.0 | 1500 | $(K_{1-x}Na_x)NbO_3$ x = 0.50 | 1 Mn | 2.0 | 500 | Second electrode layer/ Second plezoelectric layer/First piezoelectric layer/First electrode layer/Substrate | 3.0 |
| | | 2 Ba | 1.0 | | | 2 Li | 1.0 | | | |
| | | 3 Sr | 1.0 | | | 3 Ba | 1.0 | | | |
| | | 4 Ta | 1.0 | | | 4 Sr | 1.0 | | | |
| | | 5 Zr | 1.0 | | | 5 Ta | 1.0 | | | |
| | | 6 — | — | | | 6 Zr | 1.0 | | | |
| Example 11 | $(K_{1-x}Na_x)NbO_3$ x = 0.50 | 1 Li | 1.0 | 1500 | $(K_{1-x}Na_x)NbO_3$ x = 0.50 | 1 Mn | 2.0 | 500 | Second electrode layer/ Second plezoelectric layer/First piezoelectric layer/First electrode layer/Substrate | 3.0 |
| | | 2 Ba | 1.0 | | | 2 Li | 1.0 | | | |
| | | 3 Sr | 1.0 | | | 3 Ba | 1.0 | | | |
| | | 4 Ta | 1.0 | | | 4 Sr | 1.0 | | | |
| | | 5 Zr | 1.0 | | | 5 Ta | 1.0 | | | |
| | | 6 — | — | | | 6 Zr | 1.0 | | | |
| Example 12 | $(K_{1-x}Na_x)NbO_3$ x = 0.50 | 1 Li | 1.0 | 1500 | $(K_{1-x}Na_x)NbO_3$ x = 0.50 | 1 Mn | 2.0 | 500 | Second electrode layer/ Second plezoelectric layer/First piezoelectric layer/First electrode layer/Substrate | 3.0 |
| | | 2 Ba | 1.0 | | | 2 Li | 1.0 | | | |
| | | 3 Sr | 1.0 | | | 3 Ba | 1.0 | | | |
| | | 4 Ta | 1.0 | | | 4 Sr | 1.0 | | | |
| | | 5 Zr | 1.0 | | | 5 Ta | 1.0 | | | |
| | | 6 — | — | | | 6 Zr | 1.0 | | | |
| Example 13 | $(K_{1-x}Na_x)NbO_3$ x = 0.50 | 1 Li | 1.0 | 1500 | $(K_{1-x}Na_x)NbO_3$ x = 0.50 | 1 Mn | 2.0 | 500 | Second electrode layer/ Second plezoelectric layer/First piezoelectric layer/First electrode layer/Substrate | 3.0 |
| | | 2 Ba | 1.0 | | | 2 Li | 1.0 | | | |
| | | 3 Sr | 1.0 | | | 3 Ba | 1.0 | | | |
| | | 4 Ta | 1.0 | | | 4 Sr | 1.0 | | | |
| | | 5 Zr | 1.0 | | | 5 Ta | 1.0 | | | |
| | | 6 — | — | | | 6 Zr | 1.0 | | | |
| Example 14 | $(K_{1-x}Na_x)NbO_3$ x = 0.50 | 1 Li | 1.0 | 1500 | $(K_{1-x}Na_x)NbO_3$ x = 0.50 | 1 Mn | 2.0 | 500 | Second electrode layer/ Second plezoelectric layer/First piezoelectric layer/First electrode layer/Substrate | 3.0 |
| | | 2 Ba | 1.0 | | | 2 Li | 1.0 | | | |
| | | 3 Sr | 1.0 | | | 3 Ba | 1.0 | | | |
| | | 4 Ta | 1.0 | | | 4 Sr | 1.0 | | | |
| | | 5 Zr | 1.0 | | | 5 Ta | 1.0 | | | |
| | | 6 — | — | | | 6 Zr | 1.0 | | | |
| Example 15 | $(K_{1-x}Na_x)NbO_3$ x = 0.50 | 1 Li | 1.0 | 1500 | $(K_{1-x}Na_x)NbO_3$ x = 0.50 | 1 Mn | 2.0 | 500 | Second electrode layer/ Second plezoelectric layer/First piezoelectric layer/First electrode layer/Substrate | 3.0 |
| | | 2 Ba | 1.0 | | | 2 Li | 1.0 | | | |
| | | 3 Sr | 1.0 | | | 3 Ba | 1.0 | | | |
| | | 4 Ta | 1.0 | | | 4 Sr | 1.0 | | | |
| | | 5 Zr | 1.0 | | | 5 Ta | 1.0 | | | |
| | | 6 — | — | | | 6 Zr | 1.0 | | | |
| Example 16 | $(K_{1-x}Na_x)NbO_3$ x = 0.50 | 1 Li | 1.0 | 1500 | $(K_{1-x}Na_x)NbO_3$ x = 0.50 | 1 Mn | 2.0 | 500 | Second electrode layer/ Second plezoelectric layer/First piezoelectric layer/First electrode layer/Substrate | 3.0 |
| | | 2 Ba | 1.0 | | | 2 Li | 1.0 | | | |
| | | 3 Sr | 1.0 | | | 3 Ba | 1.0 | | | |
| | | 4 Ta | 1.0 | | | 4 Sr | 1.0 | | | |
| | | 5 Zr | 1.0 | | | 5 Ta | 1.0 | | | |
| | | 6 — | — | | | 6 Zr | 1.0 | | | |
| Example 17 | $(K_{1-x}Na_x)NbO_3$ x = 0.50 | 1 Li | 1.0 | 1500 | $(K_{1-x}Na_x)NbO_3$ x = 0.50 | 1 Mn | 2.0 | 500 | Second electrode layer/ Second plezoelectric layer/First piezoelectric layer/First electrode layer/Substrate | 3.0 |
| | | 2 Ba | 1.0 | | | 2 Li | 1.0 | | | |
| | | 3 Sr | 1.0 | | | 3 Ba | 1.0 | | | |
| | | 4 Ta | 1.0 | | | 4 Sr | 1.0 | | | |
| | | 5 Zr | 1.0 | | | 5 Ta | 1.0 | | | |
| | | 6 — | — | | | 6 Zr | 1.0 | | | |
| Example 18 | $(K_{1-x}Na_x)NbO_3$ x = 0.50 | 1 Li | 1.0 | 1500 | $(K_{1-x}Na_x)NbO_3$ x = 0.50 | 1 Mn | 2.0 | 500 | Second electrode layer/ Second piezoelectric layer/First piezoelectric layer/First electrode layer/Substrate | 3.0 |
| | | 2 Ba | 1.0 | | | 2 Li | 1.0 | | | |
| | | 3 Sr | 1.0 | | | 3 Ba | 1.0 | | | |
| | | 4 Ta | 1.0 | | | 4 Sr | 1.0 | | | |
| | | 5 Zr | 1.0 | | | 5 Ta | 1.0 | | | |
| | | 6 — | — | | | 6 Zr | 1.0 | | | |
| Example 19 | $(K_{1-x}Na_x)NbO_3$ x = 0.50 | 1 Li | 1.0 | 1500 | $(K_{1-x}Na_x)NbO_3$ x = 0.50 | 1 Mn | 2.0 | 500 | Second electrode layer/ Second plezoelectric layer/First piezoelectric layer/First electrode layer/Substrate | 3.0 |
| | | 2 Ba | 1.0 | | | 2 Li | 1.0 | | | |
| | | 3 Sr | 1.0 | | | 3 Ba | 1.0 | | | |
| | | 4 Ta | 1.0 | | | 4 Sr | 1.0 | | | |
| | | 5 Zr | 1.0 | | | 5 Ta | 1.0 | | | |
| | | 6 — | — | | | 6 Zr | 1.0 | | | |
| Example 20 | $(K_{1-x}Na_x)NbO_3$ x = 0.50 | 1 Li | 1.0 | 1500 | $(K_{1-x}Na_x)NbO_3$ x = 0.50 | 1 Mn | 2.0 | 500 | Second electrode layer/ Second plezoelectric layer/First piezoelectric layer/First electrode layer/Substrate | 3.0 |
| | | 2 Ba | 1.0 | | | 2 Li | 1.0 | | | |
| | | 3 Sr | 1.0 | | | 3 Ba | 1.0 | | | |
| | | 4 Ta | 1.0 | | | 4 Sr | 1.0 | | | |
| | | 5 Zr | 1.0 | | | 5 Ta | 1.0 | | | |
| | | 6 — | — | | | 6 Zr | 1.0 | | | |

TABLE 1-continued

| | First piezoelectric layer | | | | Second piezoelectric layer | | | | | |
|---|---|---|---|---|---|---|---|---|---|---|
| | | Additive | | Film thickness (nm) | | Additive | | Film thickness (nm) | | Film thickness ratio |
| | Primary component | Element | Content (at %) | | Primary component | Element | Content (at %) | | Stacking structure | |
| Example 21 | $(K_{1-x}Na_x)NbO_3$ $x = 0.50$ | 1 Li<br>2 Ba<br>3 Sr<br>4 Ta<br>5 Zr<br>6 — | 1.0<br>1.0<br>1.0<br>1.0<br>1.0<br>— | 1500 | $(K_{1-x}Na_x)NbO_3$ $x = 0.50$ | 1 Mn<br>2 Li<br>3 Ba<br>4 Sr<br>5 Ta<br>6 Zr | 2.0<br>1.0<br>1.0<br>1.0<br>1.0<br>1.0 | 500 | Second electrode layer/Second plezoelectric layer/First piezoelectric layer/First electrode layer/Substrate | 3.0 |
| Example 22 | $(K_{1-x}Na_x)NbO_3$ $x = 0.50$ | 1 Li<br>2 Ba<br>3 Sr<br>4 Ta<br>5 Zr<br>6 — | 1.0<br>1.0<br>1.0<br>1.0<br>1.0<br>— | 1500 | $(K_{1-x}Na_x)NbO_3$ $x = 0.50$ | 1 Mn<br>2 Li<br>3 Ba<br>4 Sr<br>5 Ta<br>6 Zr | 2.0<br>1.0<br>1.0<br>1.0<br>1.0<br>1.0 | 500 | Second electrode layer/Second plezoelectric layer/First piezoelectric layer/First electrode layer/Substrate | 3.0 |
| Example 23 | $(K_{1-x}Na_x)NbO_3$ $x = 0.49$ | 1 Li<br>2 Ba<br>3 Sr<br>4 Ta<br>5 Zr<br>6 — | 1.0<br>1.0<br>1.0<br>1.0<br>1.0<br>— | 1500 | $(K_{1-x}Na_x)NbO_3$ $x = 0.49$ | 1 Mn<br>2 Li<br>3 Ba<br>4 Sr<br>5 Ta<br>6 Zr | 2.0<br>1.0<br>1.0<br>1.0<br>1.0<br>1.0 | 500 | Second electrode layer/Second plezoelectric layer/First piezoelectric layer/First electrode layer/Substrate | 3.0 |
| Example 24 | $(K_{1-x}Na_x)NbO_3$ $x = 0.53$ | 1 Li<br>2 Ba<br>3 Sr<br>4 Ta<br>5 Zr<br>6 — | 1.0<br>1.0<br>1.0<br>1.0<br>1.0<br>— | 1500 | $(K_{1-x}Na_x)NbO_3$ $x = 0.53$ | 1 Mn<br>2 Li<br>3 Ba<br>4 Sr<br>5 Ta<br>6 Zr | 2.0<br>1.0<br>1.0<br>1.0<br>1.0<br>1.0 | 500 | Second electrode layer/Second plezoelectric layer/First piezoelectric layer/First electrode layer/Substrate | 3.0 |
| Example 25 | $(K_{1-x}Na_x)NbO_3$ $x = 0.58$ | 1 Li<br>2 Ba<br>3 Sr<br>4 Ta<br>5 Zr<br>6 — | 1.0<br>1.0<br>1.0<br>1.0<br>1.0<br>— | 1500 | $(K_{1-x}Na_x)NbO_3$ $x = 0.58$ | 1 Mn<br>2 Li<br>3 Ba<br>4 Sr<br>5 Ta<br>6 Zr | 2.0<br>1.0<br>1.0<br>1.0<br>1.0<br>1.0 | 500 | Second electrode layer/Second plezoelectric layer/First piezoelectric layer/First electrode layer/Substrate | 3.0 |
| Example 26 | $(K_{1-x}Na_x)NbO_3$ $x = 0.64$ | 1 Li<br>2 Ba<br>3 Sr<br>4 Ta<br>5 Zr<br>6 — | 1.0<br>1.0<br>1.0<br>1.0<br>1.0<br>— | 1500 | $(K_{1-x}Na_x)NbO_3$ $x = 0.64$ | 1 Mn<br>2 Li<br>3 Ba<br>4 Sr<br>5 Ta<br>6 Zr | 2.0<br>1.0<br>1.0<br>1.0<br>1.0<br>1.0 | 500 | Second electrode layer/Second plezoelectric layer/First piezoelectric layer/First electrode layer/Substrate | 3.0 |
| Example 27 | $(K_{1-x}Na_x)NbO_3$ $x = 0.71$ | 1 Li<br>2 Ba<br>3 Sr<br>4 Ta<br>5 Zr<br>6 — | 1.0<br>1.0<br>1.0<br>1.0<br>1.0<br>— | 1500 | $(K_{1-x}Na_x)NbO_3$ $x = 0.71$ | 1 Mn<br>2 Li<br>3 Ba<br>4 Sr<br>5 Ta<br>6 Zr | 2.0<br>1.0<br>1.0<br>1.0<br>1.0<br>1.0 | 500 | Second electrode layer/Second plezoelectric layer/First piezoelectric layer/First electrode layer/Substrate | 3.0 |
| Example 28 | $(K_{1-x}Na_x)NbO_3$ $x = 0.75$ | 1 Li<br>2 Ba<br>3 Sr<br>4 Ta<br>5 Zr<br>6 — | 1.0<br>1.0<br>1.0<br>1.0<br>1.0<br>— | 1500 | $(K_{1-x}Na_x)NbO_3$ $x = 0.75$ | 1 Mn<br>2 Li<br>3 Ba<br>4 Sr<br>5 Ta<br>6 Zr | 2.0<br>1.0<br>1.0<br>1.0<br>1.0<br>1.0 | 500 | Second electrode layer/Second plezoelectric layer/First piezoelectric layer/First electrode layer/Substrate | 3.0 |
| Example 29 | $(K_{1-x}Na_x)NbO_3$ $x = 0.81$ | 1 Li<br>2 Ba<br>3 Sr<br>4 Ta<br>5 Zr<br>6 — | 1.0<br>1.0<br>1.0<br>1.0<br>1.0<br>— | 1500 | $(K_{1-x}Na_x)NbO_3$ $x = 0.81$ | 1 Mn<br>2 Li<br>3 Ba<br>4 Sr<br>5 Ta<br>6 Zr | 2.0<br>1.0<br>1.0<br>1.0<br>1.0<br>1.0 | 500 | Second electrode layer/Second plezoelectric layer/First piezoelectric layer/First electrode layer/Substrate | 3.0 |
| Example 30 | $(K_{1-x}Na_x)NbO_3$ $x = 0.65$ | 1 Li<br>2 Ba<br>3 Sr<br>4 Ta<br>5 Zr<br>6 — | 1.0<br>1.0<br>1.0<br>1.0<br>1.0<br>— | 1500 | $(K_{1-x}Na_x)NbO_3$ $x = 0.65$ | 1 Mn<br>2 Li<br>3 Ba<br>4 Sr<br>5 Ta<br>6 Zr | 2.0<br>1.0<br>1.0<br>1.0<br>1.0<br>1.0 | 250 nm each | Second electrode layer/Second plezoelectric layer/First piezoelectric layer/First electrode layer/Substrate | 3.0 |
| Example 31 | $(K_{1-x}Na_x)NbO_3$ $x = 0.65$ | 1 Li<br>2 Ba<br>3 Sr<br>4 Ta<br>5 Zr<br>6 — | 1.0<br>1.0<br>1.0<br>1.0<br>1.0<br>— | 1900 | $(K_{1-x}Na_x)NbO_3$ $x = 0.65$ | 1 Mn<br>2 Li<br>3 Ba<br>4 Sr<br>5 Ta<br>6 Zr | 2.0<br>1.0<br>1.0<br>1.0<br>1.0<br>1.0 | 50 nm each | Second electrode layer/Second plezoelectric layer/First piezoelectric layer/First electrode layer/Substrate | 19.0 |

TABLE 1-continued

|  | First piezoelectric layer | | | | | Second piezoelectric layer | | | | | | |
|---|---|---|---|---|---|---|---|---|---|---|---|---|
|  |  | Additive | | | Film thickness (nm) |  |  | Additive | | Film thickness (nm) | Stacking structure | Film thickness ratio |
|  | Primary component |  | Element | Content (at %) |  | Primary component |  | Element | Content (at %) |  |  |  |
| Example 32 | $(K_{1-x}Na_x)NbO_3$ $x = 0.65$ | 1 | Li | 1.0 | 1850 | $(K_{1-x}Na_x)NbO_3$ $x = 0.65$ | 1 | Mn | 2.0 | 75 nm each | Second electrode layer/ Second piezoelectric layer/First piezoelectric layer/First electrode layer/Substrate | 12.3 |
|  |  | 2 | Ba | 1.0 |  |  | 2 | Li | 1.0 |  |  |  |
|  |  | 3 | Sr | 1.0 |  |  | 3 | Ba | 1.0 |  |  |  |
|  |  | 4 | Ta | 1.0 |  |  | 4 | Sr | 1.0 |  |  |  |
|  |  | 5 | Zr | 1.0 |  |  | 5 | Ta | 1.0 |  |  |  |
|  |  | 6 | — | — |  |  | 6 | Zr | 1.0 |  |  |  |
| Example 33 | $(K_{1-x}Na_x)NbO_3$ $x = 0.65$ | 1 | Li | 1.0 | 1800 | $(K_{1-x}Na_x)NbO_3$ $x = 0.65$ | 1 | Mn | 2.0 | 100 nm each | Second electrode layer/ Second piezoelectric layer/First piezoelectric layer/First electrode layer/Substrate | 9.0 |
|  |  | 2 | Ba | 1.0 |  |  | 2 | Li | 1.0 |  |  |  |
|  |  | 3 | Sr | 1.0 |  |  | 3 | Ba | 1.0 |  |  |  |
|  |  | 4 | Ta | 1.0 |  |  | 4 | Sr | 1.0 |  |  |  |
|  |  | 5 | Zr | 1.0 |  |  | 5 | Ta | 1.0 |  |  |  |
|  |  | 6 | — | — |  |  | 6 | Zr | 1.0 |  |  |  |
| Example 34 | $(K_{1-x}Na_x)NbO_3$ $x = 0.65$ | 1 | Li | 1.0 | 1700 | $(K_{1-x}Na_x)NbO_3$ $x = 0.65$ | 1 | Mn | 2.0 | 150 nm each | Second electrode layer/ Second piezoelectric layer/First piezoelectric layer/First electrode layer/Substrate | 5.7 |
|  |  | 2 | Ba | 1.0 |  |  | 2 | Li | 1.0 |  |  |  |
|  |  | 3 | Sr | 1.0 |  |  | 3 | Ba | 1.0 |  |  |  |
|  |  | 4 | Ta | 1.0 |  |  | 4 | Sr | 1.0 |  |  |  |
|  |  | 5 | Zr | 1.0 |  |  | 5 | Ta | 1.0 |  |  |  |
|  |  | 6 | — | — |  |  | 6 | Zr | 1.0 |  |  |  |
| Example 35 | $(K_{1-x}Na_x)NbO_3$ $x = 0.65$ | 1 | Li | 1.0 | 1400 | $(K_{1-x}Na_x)NbO_3$ $x = 0.65$ | 1 | Mn | 2.0 | 300 nm each | Second electrode layer/ Second piezoelectric layer/First piezoelectric layer/First electrode layer/Substrate | 2.3 |
|  |  | 2 | Ba | 1.0 |  |  | 2 | Li | 1.0 |  |  |  |
|  |  | 3 | Sr | 1.0 |  |  | 3 | Ba | 1.0 |  |  |  |
|  |  | 4 | Ta | 1.0 |  |  | 4 | Sr | 1.0 |  |  |  |
|  |  | 5 | Zr | 1.0 |  |  | 5 | Ta | 1.0 |  |  |  |
|  |  | 6 | — | — |  |  | 6 | Zr | 1.0 |  |  |  |
| Example 36 | $(K_{1-x}Na_x)NbO_3$ $x = 0.65$ | 1 | Li | 1.0 | 1200 | $(K_{1-x}Na_x)NbO_3$ $x = 0.65$ | 1 | Mn | 2.0 | 400 nm each | Second electrode layer/ Second piezoelectric layer/First piezoelectric layer/First electrode layer/Substrate | 1.5 |
|  |  | 2 | Ba | 1.0 |  |  | 2 | Li | 1.0 |  |  |  |
|  |  | 3 | Sr | 1.0 |  |  | 3 | Ba | 1.0 |  |  |  |
|  |  | 4 | Ta | 1.0 |  |  | 4 | Sr | 1.0 |  |  |  |
|  |  | 5 | Zr | 1.0 |  |  | 5 | Ta | 1.0 |  |  |  |
|  |  | 6 | — | — |  |  | 6 | Zr | 1.0 |  |  |  |
| Example 37 | $(K_{1-x}Na_x)NbO_3$ $x = 0.65$ | 1 | Li | 1.0 | 1000 | $(K_{1-x}Na_x)NbO_3$ $x = 0.65$ | 1 | Mn | 2.0 | 500 nm each | Second electrode layer/ Second piezoelectric layer/First piezoelectric layer/First electrode layer/Substrate | 1.0 |
|  |  | 2 | Ba | 1.0 |  |  | 2 | Li | 1.0 |  |  |  |
|  |  | 3 | Sr | 1.0 |  |  | 3 | Ba | 1.0 |  |  |  |
|  |  | 4 | Ta | 1.0 |  |  | 4 | Sr | 1.0 |  |  |  |
|  |  | 5 | Zr | 1.0 |  |  | 5 | Ta | 1.0 |  |  |  |
|  |  | 6 | — | — |  |  | 6 | Zr | 1.0 |  |  |  |
| Example 38 | $(K_{1-x}Na_x)NbO_3$ $x = 0.65$ | 1 | Li | 1.0 | 900 | $(K_{1-x}Na_x)NbO_3$ $x = 0.65$ | 1 | Mn | 2.0 | 550 nm each | Second electrode layer/ Second piezoelectric layer/First piezoelectric layer/First electrode layer/Substrate | 0.82 |
|  |  | 2 | Ba | 1.0 |  |  | 2 | Li | 1.0 |  |  |  |
|  |  | 3 | Sr | 1.0 |  |  | 3 | Ba | 1.0 |  |  |  |
|  |  | 4 | Ta | 1.0 |  |  | 4 | Sr | 1.0 |  |  |  |
|  |  | 5 | Zr | 1.0 |  |  | 5 | Ta | 1.0 |  |  |  |
|  |  | 6 | — | — |  |  | 6 | Zr | 1.0 |  |  |  |
| Example 39 | $(K_{1-x}Na_x)NbO_3$ $x = 0.65$ | 1 | Li | 1.0 | 800 | $(K_{1-x}Na_x)NbO_3$ $x = 0.65$ | 1 | Mn | 2.0 | 600 nm each | Second electrode layer/ Second piezoelectric layer/First piezoelectric layer/First electrode layer/Substrate | 0.67 |
|  |  | 2 | Ba | 1.0 |  |  | 2 | Li | 1.0 |  |  |  |
|  |  | 3 | Sr | 1.0 |  |  | 3 | Ba | 1.0 |  |  |  |
|  |  | 4 | Ta | 1.0 |  |  | 4 | Sr | 1.0 |  |  |  |
|  |  | 5 | Zr | 1.0 |  |  | 5 | Ta | 1.0 |  |  |  |
|  |  | 6 | — | — |  |  | 6 | Zr | 1.0 |  |  |  |
| Example 40 | $(K_{1-x}Na_x)NbO_3$ $x = 0.65$ | 1 | Li | 1.0 | 1500 | $(K_{1-x}Na_x)NbO_3$ $x = 0.65$ | 1 | Mn | 2.0 | 250 nm each | Second electrode layer/ Second piezoelectric layer/First piezoelectric layer/First electrode layer/Substrate | 3.0 |
|  |  | 2 | Ba | 1.0 |  |  | 2 | Li | 1.0 |  |  |  |
|  |  | 3 | Sr | 1.0 |  |  | 3 | Ba | 1.0 |  |  |  |
|  |  | 4 | Ta | 1.0 |  |  | 4 | Sr | 1.0 |  |  |  |
|  |  | 5 | Zr | 1.0 |  |  | 5 | Ta | 1.0 |  |  |  |
|  |  | 6 | — | — |  |  | 6 | Zr | 1.0 |  |  |  |
| Example 41 | $(K_{1-x}Na_x)NbO_3$ $x = 0.65$ | 1 | Li | 1.0 | 1500 | $(K_{1-x}Na_x)NbO_3$ $x = 0.65$ | 1 | Mn | 2.0 | 250 nm each | Second electrode layer/ Second piezoelectric layer/First piezoelectric layer/First electrode layer/Substrate | 3.0 |
|  |  | 2 | Ba | 1.0 |  |  | 2 | Li | 1.0 |  |  |  |
|  |  | 3 | Sr | 1.0 |  |  | 3 | Ba | 1.0 |  |  |  |
|  |  | 4 | Ta | 1.0 |  |  | 4 | Sr | 1.0 |  |  |  |
|  |  | 5 | Zr | 1.0 |  |  | 5 | Ta | 1.0 |  |  |  |
|  |  | 6 | — | — |  |  | 6 | Zr | 1.0 |  |  |  |

TABLE 2

|  | Displacement (μm) | | Leakage current (A/cm2) |
| --- | --- | --- | --- |
|  | 3 V | 20 V | ±20 V |
| Comparative example 1 | 0.126 | 0.148 | 1.4E−03 |
| Comparative example 2 | 0.018 | 0.362 | 8.8E−08 |
| Comparative example 3 | 0.220 | 0.238 | 3.5E−03 |
| Comparative example 4 | 0.364 | 0.756 | 2.2E−04 |
| Example 1 | 0.119 | 2.364 | 1.7E−07 |
| Example 2 | 0.158 | 3.231 | 1.6E−07 |
| Example 3 | 0.166 | 3.362 | 1.8E−07 |
| Example 4 | 0.144 | 2.952 | 1.8E−07 |
| Example 5 | 0.162 | 3.321 | 1.7E−07 |
| Example 6 | 0.180 | 3.672 | 1.7E−07 |
| Example 7 | 0.198 | 4.158 | 1.7E−07 |
| Example 8 | 0.205 | 4.330 | 1.9E−07 |
| Example 9 | 0.216 | 4.687 | 1.9E−07 |
| Example 10 | 0.436 | 8.712 | 1.9E−07 |
| Example 11 | 0.472 | 7.074 | 4.0E−07 |
| Example 12 | 0.461 | 9.216 | 2.2E−07 |
| Example 13 | 0.457 | 9.144 | 2.1E−07 |
| Example 14 | 0.450 | 9.045 | 2.0E−07 |
| Example 15 | 0.443 | 8.856 | 1.9E−07 |
| Example 16 | 0.436 | 8.712 | 1.9E−07 |
| Example 17 | 0.425 | 8.496 | 1.9E−07 |
| Example 18 | 0.418 | 8.268 | 1.3E−07 |
| Example 19 | 0.396 | 7.920 | 9.0E−08 |
| Example 20 | 0.378 | 7.636 | 7.1E−08 |
| Example 21 | 0.248 | 4.968 | 5.0E−08 |
| Example 22 | 0.198 | 3.960 | 4.0E−08 |
| Example 23 | 0.428 | 8.676 | 1.9E−07 |
| Example 24 | 0.554 | 11.920 | 8.9E−08 |
| Example 25 | 0.605 | 13.003 | 7.5E−08 |
| Example 26 | 0.648 | 13.932 | 6.5E−08 |
| Example 27 | 0.702 | 14.328 | 5.2E−08 |
| Example 28 | 0.652 | 13.814 | 6.9E−08 |
| Example 29 | 0.432 | 9.288 | 2.1E−07 |
| Example 30 | 0.666 | 17.640 | 6.0E−09 |
| Example 31 | 0.839 | 15.300 | 3.0E−08 |
| Example 32 | 0.799 | 15.264 | 2.0E−08 |
| Example 33 | 0.756 | 16.884 | 9.5E−09 |
| Example 34 | 0.731 | 17.496 | 8.0E−09 |
| Example 35 | 0.648 | 16.596 | 5.0E−09 |
| Example 36 | 0.644 | 15.840 | 3.0E−09 |
| Example 37 | 0.630 | 15.696 | 1.0E−09 |
| Example 38 | 0.558 | 14.940 | 9.0E−10 |
| Example 39 | 0.500 | 14.796 | 8.8E−10 |
| Example 40 | 0.721 | 18.990 | 4.1E−09 |
| Example 41 | 0.730 | 19.550 | 2.1E−09 |

The invention claimed is:

1. A piezoelectric element characterized by comprising a first electrode layer, a second electrode layer, and a piezoelectric layer sandwiched between the first electrode layer and the second electrode layer, wherein the piezoelectric layer is provided with at least one layer each of first piezoelectric layer which is a potassium-sodium niobate thin film substantially not containing Mn (manganese) and second piezoelectric layer which is a potassium-sodium niobate thin film containing Mn.

2. The piezoelectric element according to claim 1, characterized in that at least one of the first piezoelectric layer and the second piezoelectric layer contains at least one type of element selected from the group consisting of Li (lithium), Ba (barium), Sr (strontium), Ta (tantalum), and Zr (zirconium).

3. The piezoelectric element according to claim 1, characterized in that the content of Mn contained in the second piezoelectric layer is 0.1 atomic percent or more and 5.0 atomic percent or less.

4. The piezoelectric element according to claim 1, characterized in that the Na (sodium)/(Na+K (potassium)) ratio of the first piezoelectric layer is 0.55 or more and 0.75 or less.

5. The piezoelectric element according to claim 1, characterized in that the piezoelectric layer has a configuration in which the first piezoelectric layer is sandwiched between at least two layers of the second piezoelectric layer, and the first piezoelectric layer is disposed neither between the second piezoelectric layer and the first electrode layer nor between the second piezoelectric layer and the second electrode layer.

6. A piezoelectric actuator comprising the piezoelectric element according to claim 1.

7. A piezoelectric sensor comprising the piezoelectric element according to claim 1.

8. A hard disc drive comprising the piezoelectric actuator according to claim 6.

9. An ink-jet printer device comprising the piezoelectric actuator according to claim 6.

* * * * *